US011217537B2

(12) United States Patent
Kong et al.

(10) Patent No.: US 11,217,537 B2
(45) Date of Patent: Jan. 4, 2022

(54) DISPLAY DEVICE INCLUDING IDENTIFICATION NUMBER PATTERN

(71) Applicant: LG Display Co., Ltd., Seoul (KR)

(72) Inventors: Young-Hyun Kong, Paju-si (KR); Bum-Sik Seo, Paju-si (KR); Gyu-Bum Jang, Paju-si (KR); Bu-Yeon Kim, Paju-si (KR); Hye-Rim Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/175,770

(22) Filed: Oct. 30, 2018

(65) Prior Publication Data

US 2019/0131248 A1 May 2, 2019

(30) Foreign Application Priority Data

Oct. 31, 2017 (KR) ........................ 10-2017-0143332

(51) Int. Cl.

*H01L 23/544* (2006.01)
*G02F 1/1333* (2006.01)
*G06K 19/06* (2006.01)
*G02F 1/1335* (2006.01)

(Continued)

(52) U.S. Cl.

CPC .......... *H01L 23/544* (2013.01); *G02F 1/1333* (2013.01); *G06K 19/06009* (2013.01); *G02F 1/1368* (2013.01); *G02F 1/133374* (2021.01); *G02F 1/133514* (2013.01); *H01L 27/3276* (2013.01); *H01L 2223/5442* (2013.01); *H01L 2223/54406* (2013.01); *H01L 2223/54433* (2013.01)

(58) Field of Classification Search

CPC ............... H01L 23/544; H01L 27/3276; H01L 2223/54406; H01L 2223/5442; H01L 2223/54433; G02F 1/1333; G02F 1/133514; G02F 1/1368; G02F 2001/133374; G06K 19/06009

See application file for complete search history.

(56) References Cited

U.S. PATENT DOCUMENTS 4,536,014 A 8/1985 Boutaleb et al.
6,667,792 B2 12/2003 Park et al.

(Continued)

FOREIGN PATENT DOCUMENTS

CN 101179011 A 5/2008
CN 202929325 U 5/2013

(Continued)

OTHER PUBLICATIONS

The Intellectual Property Office of the United Kingdom, Combined Search and Examination Report under Sections 17 and 18(3), GB Patent Application No. 1817791.5, dated Apr. 26, 2019, six pages.

(Continued)

*Primary Examiner* — Rockshana D Chowdhury
*Assistant Examiner* — Douglas R Burtner
(74) *Attorney, Agent, or Firm* — Fenwick & West LLP

(57) ABSTRACT

The present disclosure relates to a display device including a first substrate and a second substrate facing each other; and a first identification number (ID) pattern positioned on a first side surface of the first substrate.

14 Claims, 9 Drawing Sheets

102
109
108
101
220
230
LGDISPLAY
200
210

(51) Int. Cl.
*G02F 1/1368* (2006.01)
*H01L 27/32* (2006.01)

(56) References Cited

U.S. PATENT DOCUMENTS

| | | | | |
|---|---|---|---|---|
| 7,778,015 | B2 * | 8/2010 | Weber | G06F 1/1616 361/679.02 |
| 9,664,933 | B2 | 5/2017 | Pang et al. | |
| 9,799,608 | B2 * | 10/2017 | Suzuki | H01L 29/872 |
| 2002/0085163 | A1 | 7/2002 | Park et al. | |
| 2005/0286000 | A1 * | 12/2005 | Tsai | G02F 1/1333 349/119 |
| 2008/0136993 | A1 * | 6/2008 | Jeong | G06Q 50/04 349/56 |
| 2012/0114921 | A1 | 5/2012 | Tsuda | |
| 2013/0036638 | A1 * | 2/2013 | Kwack | G09G 3/20 40/515 |
| 2013/0155723 | A1 * | 6/2013 | Coleman | G02B 6/0028 362/621 |
| 2013/0161322 | A1 * | 6/2013 | Li | H05K 5/0243 220/62.14 |
| 2013/0215365 | A1 * | 8/2013 | Huang | G02F 1/133528 349/96 |
| 2013/0229591 | A1 * | 9/2013 | Kong | G02F 1/136209 349/46 |
| 2014/0367658 | A1 * | 12/2014 | Kwak | H01L 27/124 257/40 |
| 2014/0368744 | A1 * | 12/2014 | Ichiza | H01L 33/64 348/731 |
| 2015/0124180 | A1 * | 5/2015 | Lee | G02F 1/133528 349/12 |
| 2015/0177548 | A1 * | 6/2015 | Jeon | G02F 1/133308 349/12 |
| 2015/0370112 | A1 * | 12/2015 | Sawabe | G06F 3/1446 349/73 |
| 2016/0026015 | A1 | 1/2016 | Pang et al. | |
| 2016/0266713 | A1 * | 9/2016 | Hashida | G06F 3/047 |
| 2016/0268212 | A1 * | 9/2016 | Suzuki | H01L 29/872 |
| 2016/0371558 | A1 | 12/2016 | Lee et al. | |
| 2016/0377905 | A1 * | 12/2016 | Choi | G02F 1/1339 257/72 |
| 2017/0147040 | A1 * | 5/2017 | Han | G06F 1/1656 |
| 2017/0256583 | A1 * | 9/2017 | Choi | G02F 1/13452 |
| 2018/0076233 | A1 * | 3/2018 | Park | H01L 29/41775 |
| 2018/0107037 | A1 * | 4/2018 | Lee | H01L 29/786 |
| 2018/0150671 | A1 * | 5/2018 | Choo | H01L 27/323 |
| 2018/0151641 | A1 * | 5/2018 | Choo | H01L 27/323 |
| 2018/0151849 | A1 * | 5/2018 | Kim | H05K 1/0393 |
| 2018/0188849 | A1 * | 7/2018 | Ko | G06F 3/0412 |
| 2018/0267345 | A1 * | 9/2018 | Chen | G02F 1/1333 |
| 2019/0067407 | A1 * | 2/2019 | Yu | G09G 3/3225 |
| 2019/0073515 | A1 * | 3/2019 | Ryu | G02B 6/005 |
| 2019/0393286 | A1 * | 12/2019 | Ding | G09G 3/3225 |

FOREIGN PATENT DOCUMENTS

| | | | |
|---|---|---|---|
| CN | 103171355 | A | 6/2013 |
| CN | 103792715 | A | 5/2014 |
| CN | 105977182 | A | 9/2016 |
| CN | 107121854 | A | 9/2017 |
| JP | 2003-322832 | A | 11/2003 |
| JP | 2016-171149 | A | 9/2016 |
| KR | 10-2002-0058276 | A | 7/2002 |
| KR | 10-2016-0148751 | A | 12/2016 |
| WO | WO 2008/004358 | A1 | 1/2008 |
| WO | WO 2011010623 | A1 | 12/2012 |

OTHER PUBLICATIONS

Korean Intellectual Property Office, Notification of Reason for Refusal, KR Patent Application No. KR 10-2017-0143332, dated Jul. 31, 2019, ten pages.

Korean Intellectual Property Office, Office Action, KR Patent Application No. 10-2017-0143332, dated Jan. 15, 2019, six pages (with concise explanation of relevance).

China National Intellectual Property Administration, Office Action, CN Patent Application No. 201811258864.8, dated Mar. 25, 2021, 18 pages.

German Patent and Trademark Office, Office Action, DE Patent Application No. 102018126963.3, dated Apr. 21, 2021, 17 pages.

* cited by examiner

ABCDE1234567890

DISPLAY DEVICE INCLUDING IDENTIFICATION NUMBER PATTERN

CROSS-REFERENCE TO RELATED APPLICATIONS

This present application claims priority to Korean Patent Application No. 10-2017-0143332, filed on Oct. 31, 2017, in the Korean Intellectual Property Office, which is incorporated herein by reference in its entirety.

BACKGROUND

1. Technical Field

The present disclosure relates to a display device including a panel identification number (ID), and more particularly, to a panel ID with an improved recognition rate in a display device having a narrow bezel.

2. Discussion of the Related Art

Recently, as society has entered an information age, a display field has rapidly developed for processing and displaying mass information and various display devices have been developed.

For example, display devices may include liquid crystal display (LCD) devices, plasma display panel (PDP) devices, field-emission display (FED) devices, electroluminescent display (ELD) devices, organic light-emitting diode (OLED) devices, and the like. The display devices have excellent characteristics of thin profile, light weight and low power consumption and are rapidly replacing the cathode ray tubes (CRTs).

Among such display devices, an LCD device includes an array substrate including a thin film transistor, a color filter substrate including a color filter and/or a black matrix, and a liquid crystal layer between the array substrate and the color filter substrate, so that a display panel is provided. An alignment state of the liquid crystal layer is controlled according to an electric field applied between two electrodes of a pixel region, and the transmittance of light is controlled. As a result, an image is displayed.

An OLED device includes a first substrate including switching and driving thin film transistors, first and second electrodes, and an organic light-emitting layer between the first and second electrodes and a second substrate bonded to an upper portion of the first substrate, so that a display panel is provided. A degree of light emission of an organic material is controlled according to a level of a voltage or an amount of a current applied between two electrodes of a pixel region, so that an image is displayed.

In the display device, a panel identification number (ID) may be used to manage the history of the display panel and in performing various processes (scribing, grinding, module-assembling process, etc.) in the display panel.

As shown in FIG. 1, a panel ID 20 is formed on a non-display region N/A, which is positioned along edges of a display region A/A of a display panel 10 including first and second substrates 1 and 2. The panel ID 20 includes information on the characteristics and history of the display panel 10.

Meanwhile, studies are actively being conducted to minimize a bezel region of a display device. However, a space for forming the panel ID 20 is insufficient in a structure in which the non-display region N/A of the display panel 10 of the display device is minimized.

SUMMARY

Accordingly, the present disclosure is directed to a display device that substantially obviates one or more of the problems due to limitations and disadvantages of the related art.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

In accordance with the present disclosure, as embodied and broadly described herein, the present disclosure provides a display device including a first substrate and a second substrate facing each other; and a first identification number (ID) pattern positioned on a first side surface of the first substrate.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain embodiments of the present disclosure.

DETAILED DESCRIPTION

Reference will now be made in detail to the preferred embodiments, examples of which are illustrated in the accompanying drawings.

Figure 2A:
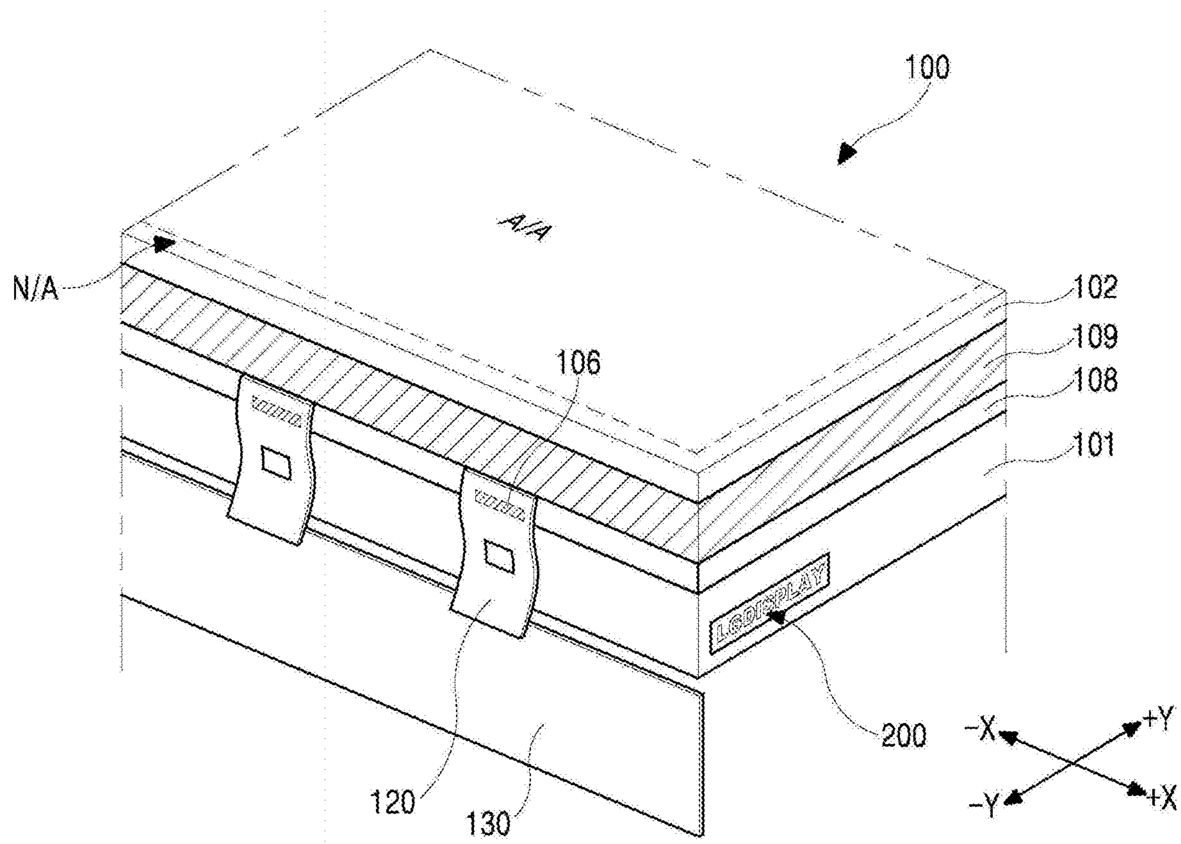
FIG. 2A is a side perspective view schematically showing a display device according to an embodiment of the present disclosure.
Figure 2B:
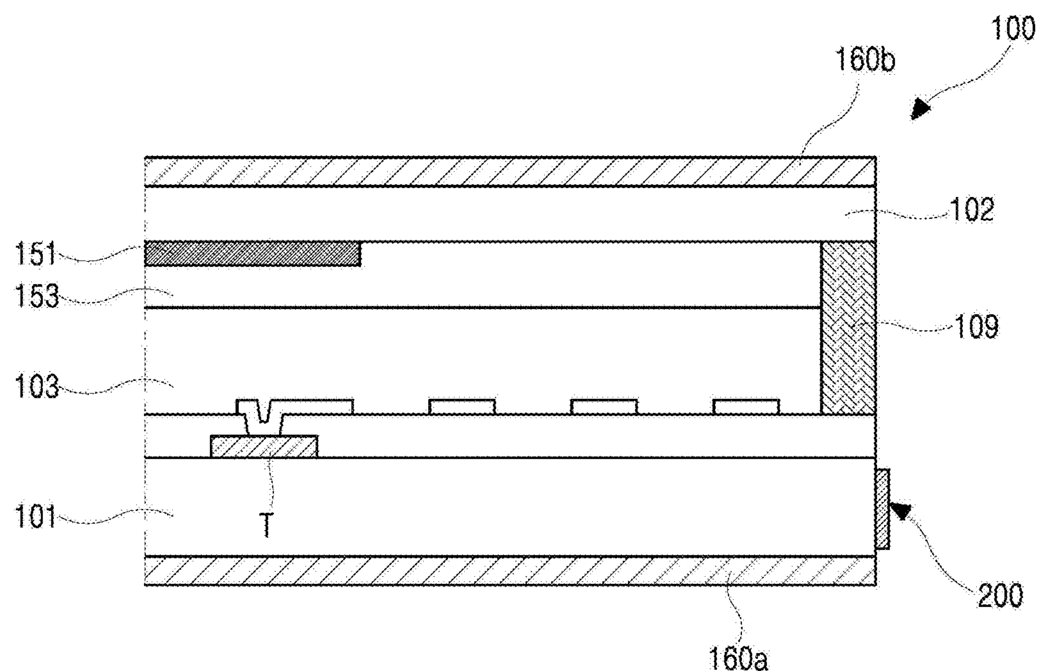
FIG. 2B is a cross-sectional view schematically showing a display panel for a liquid crystal display device.
Figure 2C:
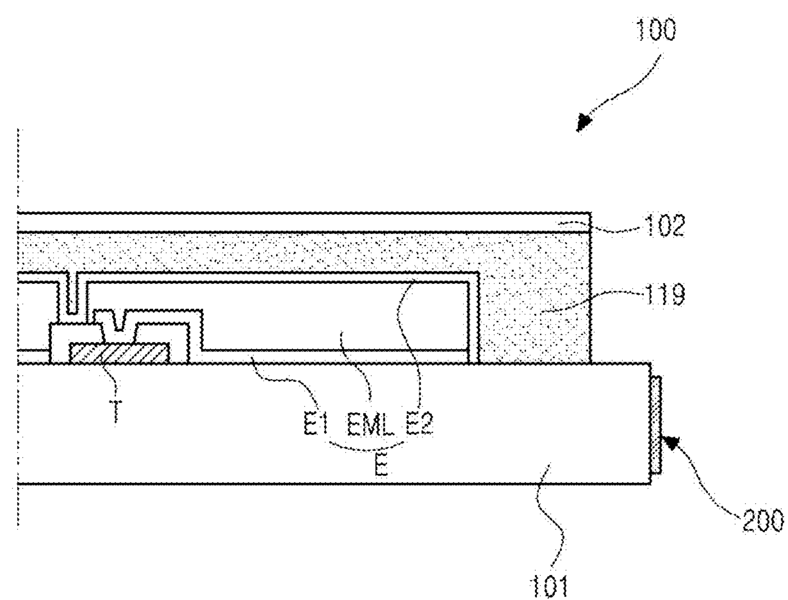
FIG. 2C is a cross-sectional view schematically showing a display panel for an organic light-emitting display device.
Figure 2D:
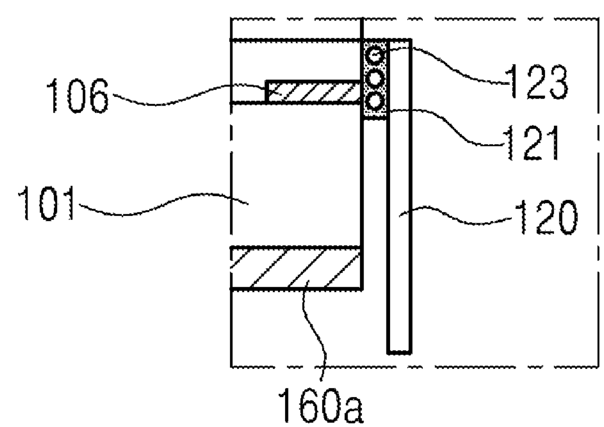
FIG. 2D is a cross-sectional view schematically showing a connecting member and a pad for a display device.

FIG. 2A is a side perspective view schematically showing a display device according to an embodiment of the present disclosure, FIG. 2B is a cross-sectional view schematically showing a display panel for a liquid crystal display device (LCD) and FIG. 2C is a cross-sectional view schematically showing a display panel for an organic light-emitting display device (OLED), and FIG. 2D is a cross-sectional view schematically showing a connecting member and a pad for a display device.

As shown in FIG. 2A, a display panel 100 for a display device includes a first substrate 101 as a lower substrate, a second substrate 102 as an upper substrate and a seal pattern 109, which may be a protective layer 119 in another embodiment, between the first and second substrates 101 and 102. The first and second substrates 101 and 102 are bonded to each other. A thin film transistor (not shown), first and second electrodes (not shown) for an emitting diode, a plurality of lines (not shown), a pad 106 connected to an end of the line, and an insulating layer 108 on the pad 106 are formed on the first substrate 101. The lines may be signal lines, such as a gate line and a data line, a common line, and the like, or may be non-signal lines, such as a line for preventing electrostatic discharge (not shown) and the like.

In the display panel 100 according to the embodiment of the present disclosure, the first substrate 101 and the second substrate 102 are formed in the same shape such that one end of the first substrate 101 and one end of the second substrate 102 coincide with each other. A side surface of the pad 106 at the end of the line, which is provided on the first substrate 101, is exposed at a space between the first substrate 101 and the second substrate 102.

A printed circuit board 130 is connected to one side of the display panel 100 via a connecting member 120 which may be a flexible printed circuit board. In this case, the connecting member 120 is attached and connected to a side surface of the display panel 100.

That is, the connecting member 120 is electrically connected to the side surface of the pad 106 exposed at the space between the first substrate 101 and the second substrate 102 by an adhesion layer (121) including a conductive ball (123), and the printed circuit board 130 is connected to the connecting member 120. In other words, one end of the connecting member 120 is connected to the side surface of the pad 106, and the other end of the connecting member 120 is connected to the printed circuit board 130. An example of this connection may be referred to in FIG. 2D.

In FIG. 2A, the connecting member 120 and the printed circuit board 130 are disposed at only one side surface of the display panel 100. Alternatively, the connecting member 120 and the printed circuit board 130 may be additionally disposed at another side surface of the display panel 100.

The pads 106 may be formed as one body in the same layer as the lines (not shown). Alternatively, the lines may include a data line (not shown) provided on a gate insulating layer (not shown), and the pad 106 may include a data pad provided under the gate insulating layer. In this case, the data pad is connected to the data line via a contact hole (not shown) provided in the gate insulating layer.

In the display panel 100, the side surface of the pad 106 is exposed at a side surface of the first substrate 101, and the connecting member 120 is attached and connected to the side surfaces of the first and second substrates 101 and 102. Accordingly, a separate pad-forming region (i.e., a pad portion) is not required on the first and second substrates 101 and 102.

Namely, all regions of the display panel 100, except only a minimum edge region (i.e., a non-display region N/A), form a display region A/A on which an image is realized.

In the display panel 100, a narrow bezel can be realized as the edge region, which is the non-display region N/A, is minimized.

As described above, in the display panel 100 according to the embodiment of the present disclosure in which the non-display region N/A is minimized, a panel identification number (ID) 200, also referred to as a panel ID 200, is positioned on the side surface of the first substrate 101.

The panel ID 200 may enable product quality assurance, history traceability of individual products, and production management in the manufacturing of the display device.

For example, several process steps are required to manufacture the display panel 100. When the production history of the corresponding display panel 100 is required by a user or a production system, information on the production history of the corresponding display panel 100 and the like may be obtained by reading the panel ID 200.

The panel ID 200 may include digits, letters, shapes, or a combination thereof, and may include a unique number for the display panel 100.

In addition, the panel ID 200 may include information on the characteristics and history of the display panel 100 and may be formed in the form of Varicode. The panel ID 200 may include information on the characteristics of components of the display panel 100, such as a thin film transistor (not shown) and information on the manufacturing history of the display panel 100, such as a model name, a manufacturing place, a manufacturing time, and the like.

In the display device 100, since the panel ID 200 is positioned on the side surface of the first substrate 101, a narrow bezel can be realized, and information on a production process and a distribution process of the display panel 100 can be managed using the panel ID 200.

Namely, since the information on the characteristics of the respective components of the display panel 100, a model name, a manufacturing place, a manufacturing time, and the like of the display panel 100 may be managed using the panel ID 200, the efficiency of the process can be improved. In addition, when a failure occurs in the field after assembling modules, it is also possible to distinguish when the problematic display panel 100 was manufactured. Accordingly, it is easy to analyze the failure.

Further, the panel ID 200 of the display panel 100 may be identified at any time in any step during or after the production of the display panel 100 so that the production history of the display panel 100 can be easily managed and thus the efficiency of the process can be improved.

Figure 1:
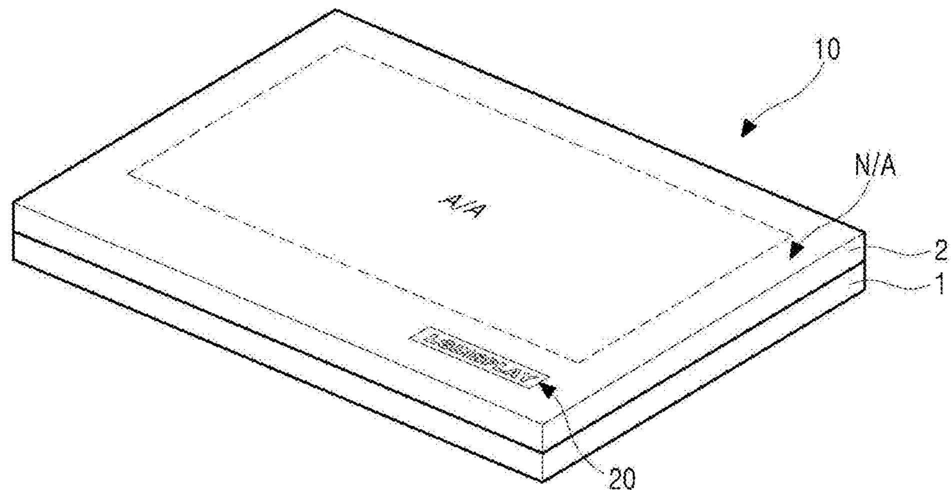
FIG. 1 is a perspective view schematically showing a general display panel.

Moreover, since the panel ID 200 is positioned on the side surface of the first substrate 101, the panel ID 200 may be formed with less restrictions on a size of the panel ID 200 in comparison to a conventional panel ID formed in the non-display region N/A, as shown in FIG. 1, and a more freedom in terms of the size or shape of the panel ID 200 can be enabled.

Specifically, since the panel ID 200 is positioned on the side surface of the display panel 100, the panel ID 200 may be easily recognized in the display panel 100.

The panel ID 20 (of FIG. 1) is positioned in the non-display region N/A (of FIG. 1) of the substrate 1 (of FIG. 1), on which a switching element such as a thin film transistor (not shown) is formed. In this case, the panel ID 20 is formed of the same material and on the same layer as an electrode (not shown) of the thin film transistor or a line (not shown).

That is, the panel ID 20 provided on the display panel 10 is positioned inside the display panel 10. Therefore, it is very difficult to identify the panel ID 20 in the display panel 10, and a separate device for identifying the panel ID 20 is required.

On the other hand, in the display panel 100 according to the embodiment of the present disclosure, the panel ID 200 is positioned on the side surface of the first substrate 101 of the display panel 100, and thus the panel ID 200 is positioned to be exposed to the outside of the display panel 100. Therefore, the panel ID 200 may be more easily recognized.

A position of the panel ID 200 will be described in more detail with reference to FIGS. 2A and 2B. When the display panel 100 is formed as a LCD, as shown in FIG. 2B, a thin film transistor T is provided on the first substrate 101, a color filter pattern 153 and/or a black matrix 151 are provided on the second substrate 102. A liquid crystal layer 103 is interposed between the first substrate 101 and the second substrate 102.

A first polarizer 160*a* and a second polarizer 160*b*, which selectively transmit only specific light, are attached to an outer surface of the first substrate 101 and an outer surface of the second substrate 102, respectively. A seal pattern 109 is formed along edges of both substrates 101 and 102 to prevent leakage of the liquid crystal layer 103 between the first and second substrates 101 and 102.

In this case, when the panel ID 200 is positioned on the side surface of the first substrate 101 on which the thin film transistor T is provided, the panel ID 200 is positioned under the thin film transistor T and is positioned above the first polarizer 160*a*. Namely, the panel ID 200 is disposed at a position between the thin film transistor T and the first polarizer 160*a*. In addition, the panel ID 200 is positioned outside the seal pattern 109.

Here, reference numeral 109 indicates the seal pattern 109 in the display panel 100 for an LCD.

As shown in FIG. 2C, when the display panel 100 is formed as an OLED device, a switching thin film transistor and a driving thin film transistor T is provided on the first substrate 101, and a light-emitting diode E including first and second electrodes E1 and E2 and an organic light emitting layer EML is provided above the switching thin film transistor and the driving thin film transistor T. The second substrate 102 is bonded to be spaced apart from the first substrate 101 by a protective layer 119 having an adhesion property.

When the panel ID 200 is positioned on the side surface of the first substrate 101, on which the switching thin film transistor, the driving thin film transistor T and the light-emitting diode E are provided, the panel ID 200 is positioned under the switching thin film transistor, the driving thin film transistor T and the light-emitting diode E and is positioned outside the protective layer 119.

In the display panel 100 for an OLED, the second substrate 102 may be omitted.

Referring to FIG. 2A, the panel ID 200 is preferably positioned at a surface of the display panel 100, on which the pad 106 is not exposed. When the panel ID 200 is formed on the surface, where the pad 106 is disposed, the pad 106 may be damaged by laser emission to the side surface of the first substrate 101 in the process of forming the panel ID 200.

Alternatively, the panel ID 200 may be positioned on the side surface of the second substrate 102. The panel ID 200 may be positioned on the side surface of at least one of the first and second substrates 101 and 102. As the substrate provides a sufficiently rigid material, the panel ID can be reliably formed, e.g. by use of laser or any other forming process.

When multiple panel IDs 200 are positioned on both of the side surface of the first substrate 101 and the side surface of the second substrate 102, a panel ID 200 positioned on the side surface of the second substrate 102 and a panel ID 200 positioned on the side surface of the first substrate 101 are preferably positioned to face different directions.

The panel IDs 200 on the first and second substrate can be the same, but it is also possible to have parts of the panel ID 200 on the first substrate and remaining other parts of the panel ID 200 on the second substrate. In such a case, the parts of the panel ID 200 should be provided on one side of the first and second substrate to easily recognize the full panel ID 200 being combined by the two or more parts of the panel ID 200 provided on the first and second substrate.

Namely, when the panel ID 200 positioned on the side surface of the first substrate 101 is positioned on one side surface of the first substrate 101, which faces a positive (+) X direction, the panel ID 200 positioned on the side surface of the second substrate 102 is positioned on one side surface of the second substrate 102, which faces a Y direction or a negative (−) X direction.

When the panel IDs 200 on both the side surface of the first substrate 101 and the side surface of the second substrate 102 face the same direction, there may be difficulty in reading the panel ID 200 of the display panel 100 using a camera or the like. Preferably, in such a case, the panel IDs 200 provided on the opposing sides of the first and/or second substrate are similar, so the code or pattern can be read independently from the direction of the display panel, making the reading easier and avoiding the need to rotate the display panel during manufacturing or assembling for reading the panel ID 200.

Hereinafter, a configuration, in which the panel ID 200 is positioned on the side surface of the first substrate 101, will be described as an example.

Figures 3A, 3B:
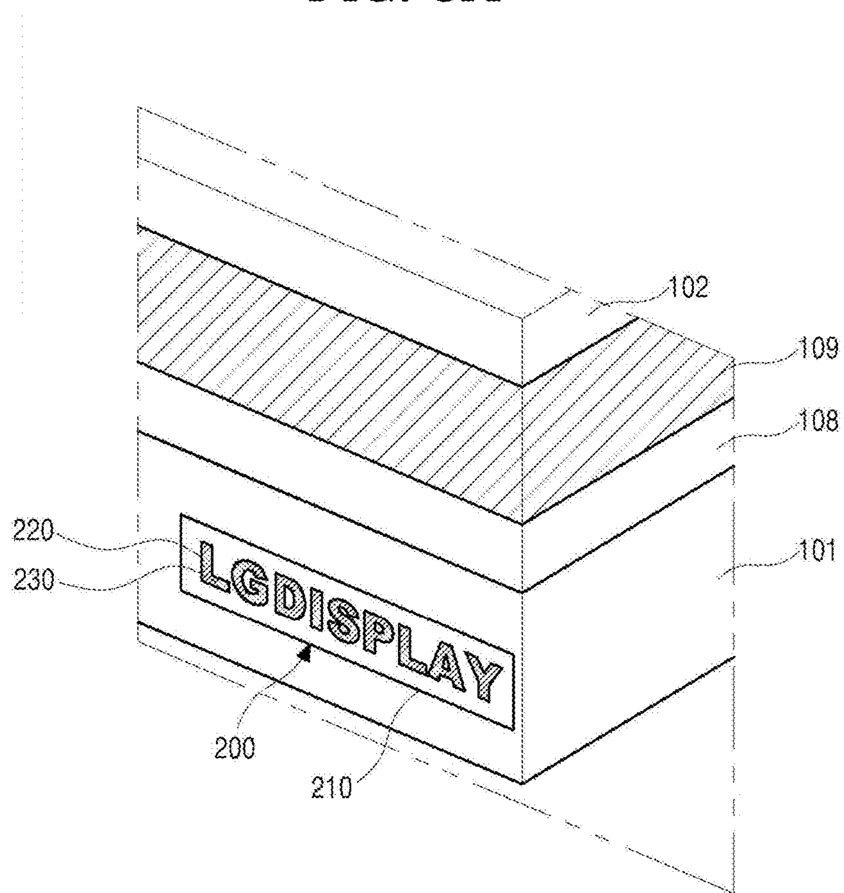
FIG. 3A is an enlarged view showing a panel identification number (ID) according to a first embodiment of the present disclosure.
FIG. 3B is an experimental photograph obtained by measuring the panel ID according to the first embodiment of the present disclosure.

FIG. 3A is an enlarged view showing a panel ID according to a first embodiment of the present disclosure, and FIG. 3B is an experimental photograph obtained by measuring the panel ID according to the first embodiment of the present disclosure.

As shown in FIG. 3A, in the panel ID 200 positioned on a side surface of a first substrate 101 according to the first embodiment of the present disclosure, a panel ID pattern 220 is included in a panel ID region 210. The panel ID pattern 220 may be formed by coating a surface thereof with a reflective layer 230.

The reflective layer 230 includes a light reflective material. For example, the panel ID pattern 220 may be formed by coating a surface of the panel ID pattern 220 with at least one of titanium dioxide, aluminum, aluminum oxide, barium sulfate, calcium carbonate, calcium sulfate, magnesium sulfate, barium carbonate, zinc oxide, magnesium hydroxide, calcium hydroxide, and talc.

In the panel ID 200 according to the first embodiment of the present disclosure, a contrast difference is generated between the panel ID pattern 220 and the first substrate 101, and thus the panel ID 200 may be recognized clearly as shown in FIG. 3B.

Specifically, since the reflective layer 230 is formed on the surface of the panel ID pattern 220, the panel ID 200 may be read using a detection system provided for detecting a process key or an alignment key in addition to a camera.

That is, the process key or the alignment key is recognized by detecting light which is reflected after light is irradiated on the process key or the alignment key.

In this case, as the reflective layer 230 is formed on the surface of the panel ID 200, the panel ID 200 may also be read by detecting the light which is reflected after light is irradiated on the panel ID 200.

Therefore, a separate device for detecting the panel ID 200 may be omitted.

The panel ID region 210 may also be omitted.

Figure 4:
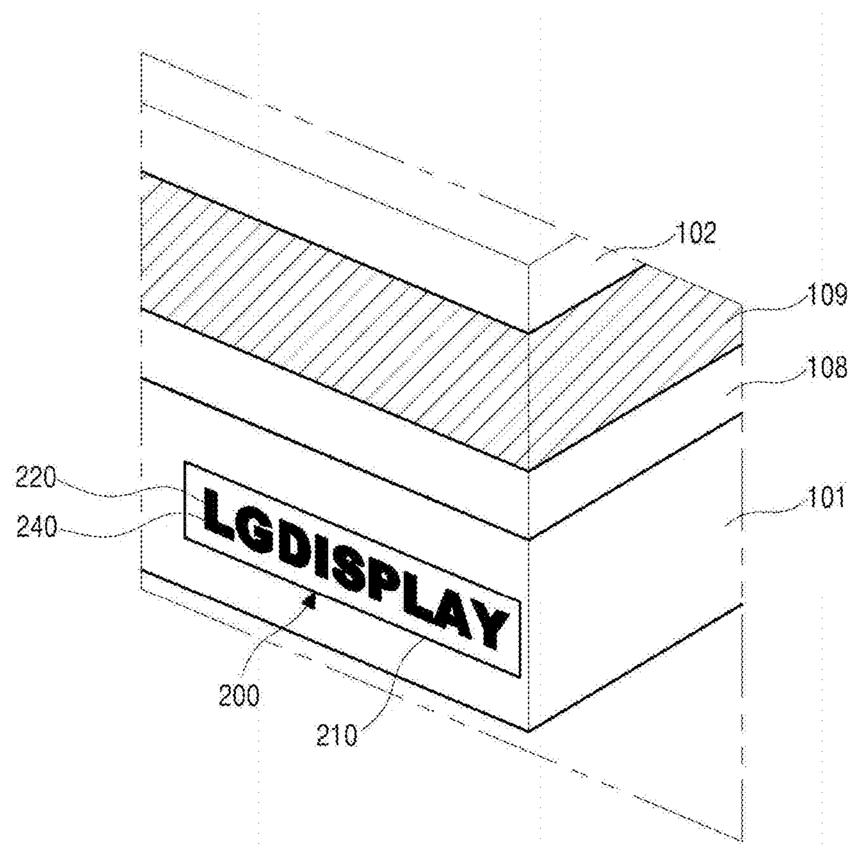
FIG. 4 is an enlarged view showing a panel ID according to a second embodiment of the present disclosure.

FIG. 4 is an enlarged view showing a panel ID according to a second embodiment of the present disclosure.

As shown in FIG. 4, in a panel ID 200 positioned on a side surface of a first substrate 101 according to the second embodiment of the present disclosure, a panel ID pattern 220 is included in a panel ID region 210. A surface of the panel ID pattern 220 may include a black dye 240.

In the panel ID 200 according to the second embodiment of the present disclosure, in which the surface includes the black dye 240, a contrast difference is generated between the panel ID pattern 220 and the first substrate 101, and thus the panel ID 200 may be recognized more clearly.

Since the surface of the panel ID pattern 220 includes the black dye 240, the panel ID 200 may also be read by detecting light which is reflected after light is irradiated on the panel ID 200. Therefore, a separate device for detecting the panel ID 200 may be omitted.

The black dye 240 may be formed by separately coating the surface of the panel ID pattern 220. Alternatively, the black dye 240 may be spontaneously generated in a process of imprinting the panel ID pattern 220 on the side surface of the first substrate 101 using a laser.

The panel ID region 210 may be omitted.

Figure 5A:
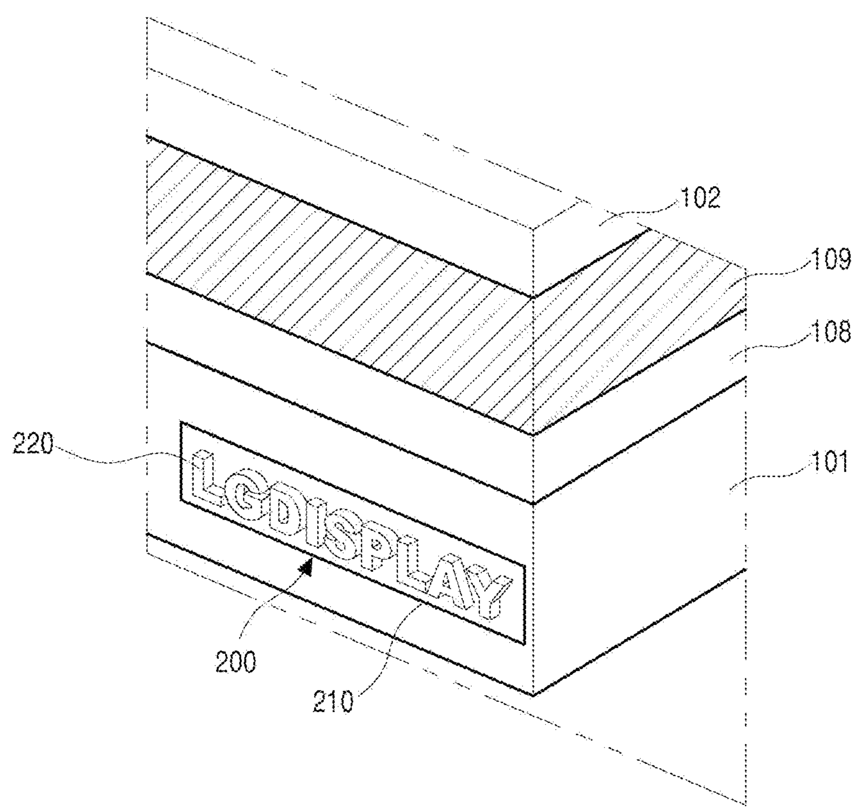
FIGS. 5A to 5C are enlarged views showing a panel ID according to a third embodiment of the present disclosure.
Figure 5B:
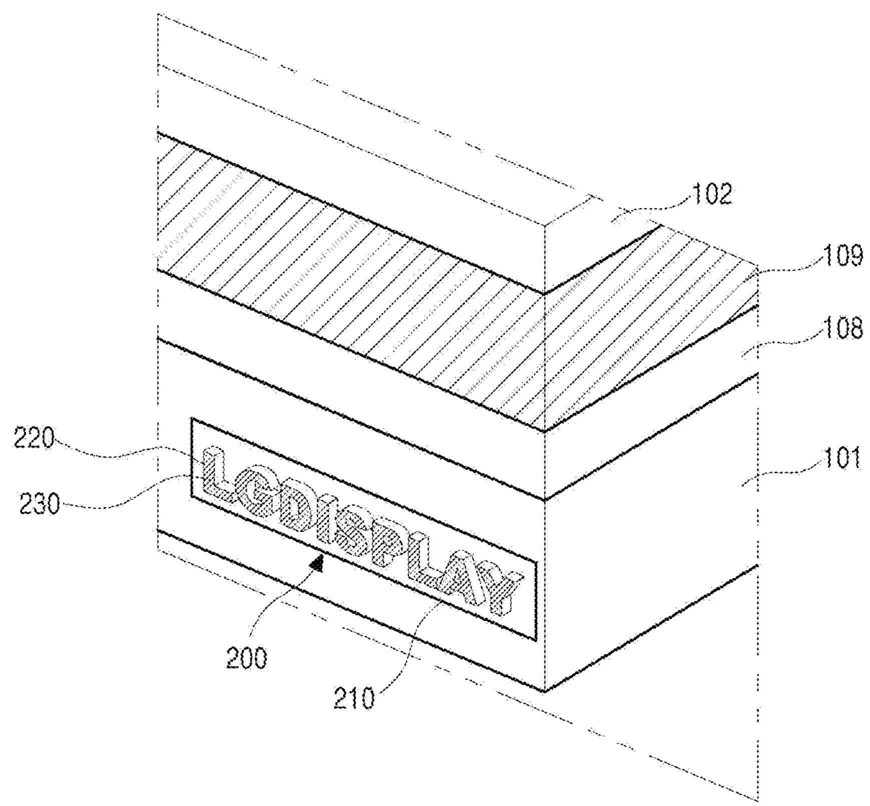
Figure 5C:
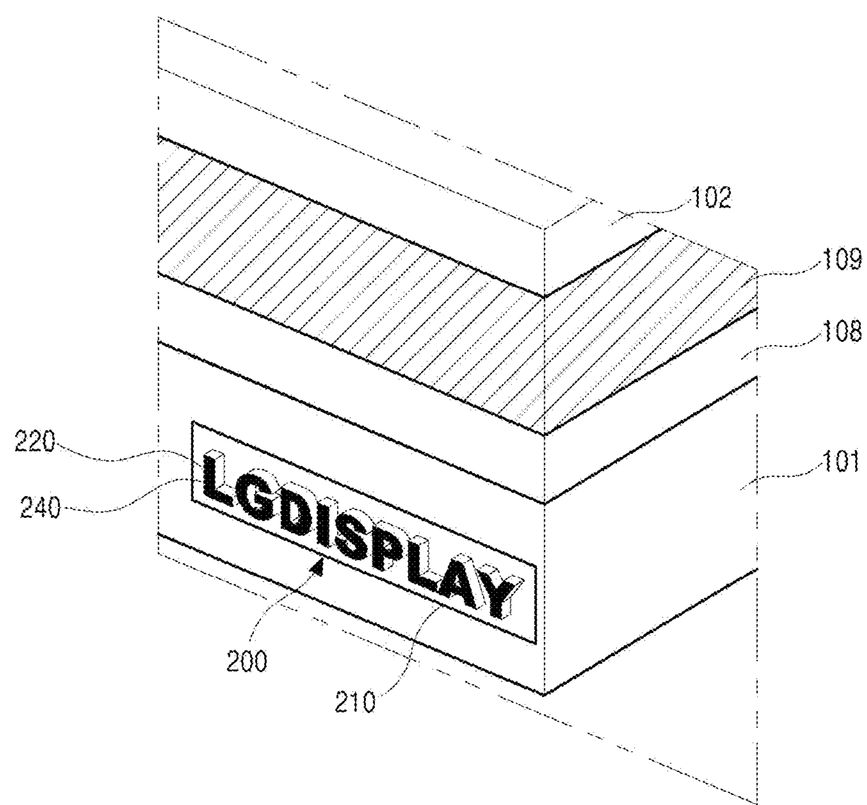

FIGS. 5A to 5C are enlarged views showing a panel ID according to a third embodiment of the present disclosure.

As shown in FIG. 5A, in a panel ID 200 positioned on a side surface of a first substrate 101 according to the third embodiment of the present disclosure, a panel ID pattern 220 is included in a panel ID region 210. The panel ID pattern 220 is formed to protrude from the side surface of the first substrate 101 in an embossed manner.

In this case, a reflective layer 230 may be further formed on a surface of the panel ID pattern 220 formed to protrude in the embossed manner, as shown in FIG. 5B. A black dye 240 may be formed by further coating the surface of the panel ID pattern 220, as shown in FIG. 5C.

In the panel ID 200 according to the third embodiment of the present disclosure, a contrast difference is generated between the panel ID pattern 220 and the first substrate 101, and thus the panel ID 200 may be more clearly recognized.

As described above, the panel ID pattern 220 is formed to protrude from the side surface of the first substrate 101 in the embossed manner so that the panel ID pattern 220 has a three-dimensional effect. Accordingly, it is possible to prevent an occurrence of a problem such as the panel ID 200 being erased or the like.

Although not shown, the panel ID pattern 220 may be formed to be concave from the side surface of the first substrate 101 in an intaglio manner. In the panel ID 200 according to the third embodiment of the present disclosure, the panel ID region 210 may be omitted.

Figures 6A, 6B:
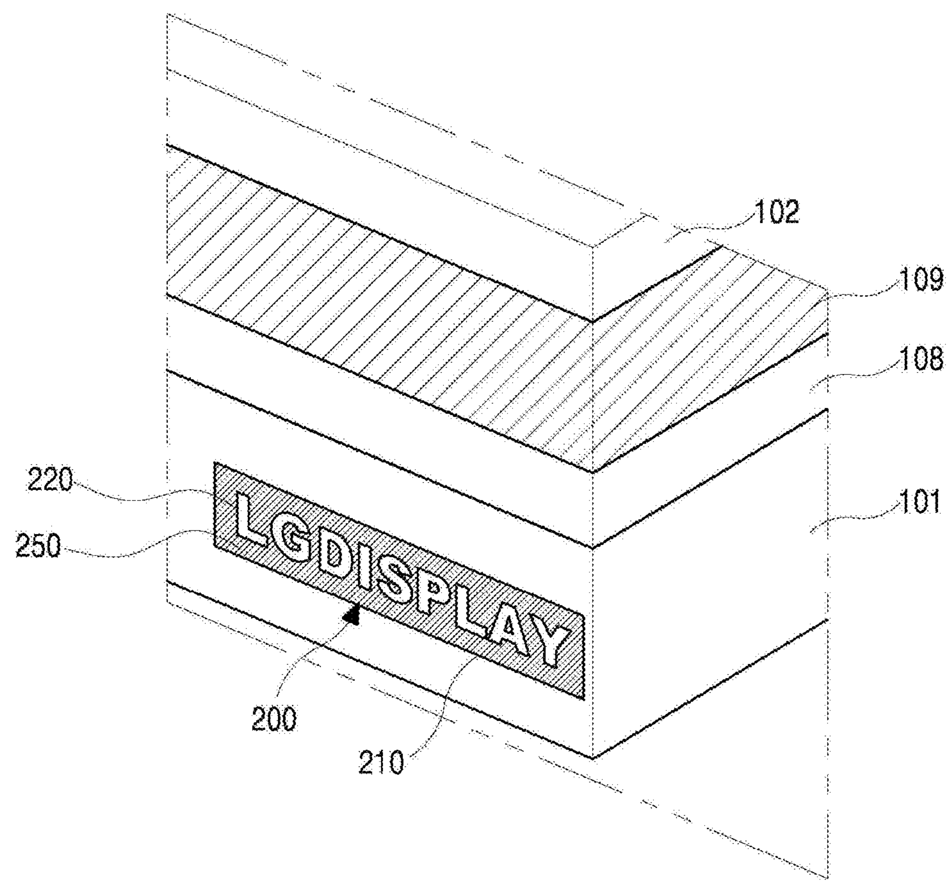
FIG. 6A is an enlarged view showing a panel ID according to a fourth embodiment of the present disclosure.
FIG. 6B is an experimental photograph obtained by measuring the panel ID according to the fourth embodiment of the present disclosure.

FIG. 6A is an enlarged view showing a panel ID according to a fourth embodiment of the present disclosure, and FIG. 6B is an experimental photograph obtained by measuring the panel ID according to the fourth embodiment of the present disclosure.

As shown in FIG. 6A, in a panel ID 200 of a side surface of a first substrate 101 according to the fourth embodiment of the present disclosure, a panel ID pattern 220 is included in a panel ID region 210. The panel ID region 210 around the panel ID pattern 220 includes a grinding surface treatment layer 250.

The panel ID region 210 including the grinding surface treatment layer 250 is opaque state so that shading is realized with the panel ID pattern 220.

Therefore, a contrast difference is generated between the panel ID region 210 and the panel ID pattern 220 and thus the panel ID 200 may be more clearly recognized, as shown in FIG. 6B.

In the panel ID 200 according to the fourth embodiment of the present disclosure, the grinding surface treatment layer 250 is formed directly on the side surface of the first substrate 101, and thus it is possible to prevent an occurrence of a problem such as the panel ID 200 being erased or the like.

In addition, the grinding surface treatment layer 250 is formed in the panel ID region 210 so that the panel ID region 210 has a roughness. The panel ID pattern 220 is imprinted in the panel ID region 210, so that it is possible to prevent an occurrence of a problem such as the slippage of a laser for imprinting the panel ID pattern 220 due to the roughness of the panel ID region 210.

As described above, in the display panel 100 according to the embodiment of the present disclosure, the panel ID 200 is positioned on the side surface of the first substrate 101 so that a narrow bezel can be realized and information on a production process and a distribution process of the display panel 100 can be managed using the panel ID 200.

Therefore, the efficiency of the process can be improved. When a failure occurs in the field after assembling modules, it is also possible to distinguish when the problematic display panel 100 was manufactured, and it is easy to analyze the failure.

In addition, since the panel ID 200 of the display panel 100 may be identified at any time in any step during or after the production of the display panel 100, the production history of the display panel 100 can be easily managed, and thus the efficiency of the process can be improved.

Moreover, in the display panel 100 according to the embodiment of the present disclosure, the surface of the panel ID pattern 220 of the panel ID 200 is coated with a reflective layer 230 or a black dye 240, the panel ID pattern 220 is formed in an embossed manner, or a grinding surface treatment layer 250 is formed in the panel ID region 210, and thus the panel ID 200 may be more clearly recognized.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display device including identification number pattern, comprising:

a first substrate and a second substrate, wherein an inner surface of the first substrate faces an inner surface of the second substrate, and wherein a first side surface of the first substrate extends in a first direction perpendicular to a second direction along the inner surface of the first substrate; and a first identification number (ID) pattern positioned on the first side surface of the first substrate, wherein the first identification number (ID) pattern is spaced apart from each of the inner surface of the first substrate and an outer surface of the first substrate, wherein the first identification number (ID) pattern is not overlapped with either of the inner surface of the first substrate or the inner surface of the second substrate, and wherein the inner surface and the outer surface of the first substrate face opposite directions.

2. The display device according to claim 1, wherein the first ID pattern includes at least one of digits, letters, and shapes.

3. The display device according to claim 1, wherein a reflective layer is positioned on a surface of the first ID pattern.

4. The display device according to claim 3, wherein the first ID pattern protrudes from the first side surface of the first substrate in an embossed manner.

5. The display device according to claim 1, wherein a surface of the first ID pattern includes a black dye.

6. The display device according to claim 5, wherein the first ID pattern protrudes from the first side surface of the first substrate in an embossed manner.

7. The display device according to claim 1, wherein the first ID pattern is positioned in a panel ID region, and the panel ID region has an opaque surface treatment layer.

8. The display device according to claim 1, further comprising:

a second ID pattern positioned on a side surface of the second substrate.

9. The display device according to claim 8, wherein the first ID pattern and the second ID pattern are positioned to face different directions.

10. The display device according to claim 1, further comprising:

a pad provided on the first substrate, wherein a side surface of the pad is exposed at a second side surface of the first substrate.

11. The display device according to claim 10, wherein the first side surface and the second side surface are different directions.

12. The display device according to claim 10, further comprising:

a connecting member connected to the side surface of the pad by an adhesion layer including a conductive ball.

13. The display device according to claim 1, wherein a thin film transistor is positioned on the inner surface of the first substrate.

14. The display device according to claim 1, wherein a side end of the first substrate and a side end of the second substrate coincide with each other.

* * * * *